United States Patent
Ambe et al.

[11] Patent Number: 6,130,429
[45] Date of Patent: Oct. 10, 2000

[54] MINIATURIZED SECONDARY ELECTRON DETECTOR

[75] Inventors: Takayuki Ambe; Ichiro Honjo, both of Kawasaki, Japan

[73] Assignee: Fujitsu Limited, Kawasaki, Japan

[21] Appl. No.: 09/198,572

[22] Filed: Nov. 23, 1998

[30] Foreign Application Priority Data

Feb. 17, 1998 [JP] Japan .................................. 10-034675

[51] Int. Cl.$^7$ .................................................. H01J 37/244
[52] U.S. Cl. .......................................... 250/310; 250/397
[58] Field of Search ...................................... 250/310, 397

[56] References Cited

U.S. PATENT DOCUMENTS 4,958,079  9/1990  Gray ........................................ 250/397

FOREIGN PATENT DOCUMENTS 63-108655  5/1988  Japan .

OTHER PUBLICATIONS

T. Chang, et al., "Electron–Beam Microcolumns for Lithography and Relatted Applications"; *JVST*, B 14(6), Nov./Dec. 1996.

Micro Sphere Plate, El–Mul Technologies Ltd. undated.

*Primary Examiner*—Kiet T. Nguyen
*Attorney, Agent, or Firm*—Staas & Halsey

[57] ABSTRACT

To miniaturize a secondary-electron detector, a ring-shaped secondary-electron emissive material layer 44A is formed on a ring-shaped base 41 having a round hole 41a, via a ring-shaped insulating layer 42A and a ring-shaped high resistance layer 43A. Similarly, a ring-shaped secondary-electron emissive material layer 44B is formed on a ring-shaped base 33 having a round hole 33a, via a ring-shaped insulating layer 42B and a ring-shaped high resistance layer 43B. A arc-shaped multiplied-electron collecting electrode 461 is joined between the insulating layers 42A and 42B outside the secondary-electron emissive material layer 44B. A porous secondary-electron multiplication substance may be filled between opposed bases instead of the secondary-electron emissive material layers 44A and 44B, and an optical fiber coated with phosphor may be used instead of the electrode 461.

20 Claims, 11 Drawing Sheets

MINIATURIZED SECONDARY ELECTRON DETECTOR

BACKGROUND OF THE INVENTION

1. Field of the Invention

The present invention relates to a miniaturized secondary-electron detector and a miniaturized electron-beam system such as a SEM (scanning electron microscope) using the same.

2. Description of the Related Art

When observing a minute sample or a minute pattern on a sample by a miniaturized electron-beam system, it is necessary to improve the resolving power by finely focusing the beam. If high energy, for example, a 50 kV beam is used, it is possible to finely focus the beam. To the contrary, with a miniaturized electron-beam system using a micro column (T. H. P. Chang et al., J. Vac. Scl. Technol. B, Vol. 14, No. 6, 3774, November/December 1966), if low energy, for example, a 1 kV beam is used, it is possible to finely focus the beam.

There are MCP (microchannel plate) and MSP (micro sphere plate) as a miniaturized secondary-electron detector used for a miniaturized electron-beam system.

However, since the MCP and MSP are constructed so that electrons incident to one side of a plate are multiplied to output electrons from the opposing side of the plate with voltage applied between the sides of the plate, they are too large as regards a miniaturized electron-beam system in which a lens having an bore diameter of 200 $\mu$m or the like and a column 3.5 mm long or so are used. Although a multiple miniaturized electron-beam system in which a plurality of micro columns are arrayed has been proposed, they can not be applied to this system because the miniaturized secondary-electron detector is too large and one detector can not serve for a plurality of micro columns. Therefore, the miniaturized electron-beam system could be used for only micro lithography where the miniaturized secondary-electron detector is not used.

SUMMARY OF THE INVENTION

In view of these problems, it is therefore an object of the present invention to provide a miniaturized secondary-electron detector used for a miniaturized electron-beam system and a miniaturized electron-beam system using the same.

In the 1st aspect of the present invention, there is provided a secondary-electron detector, comprising: a first base having a first hole; a second base, having a second hole corresponding to the first hole, opposed to the first base; an electron multiplier, for multiplying the number of electrons by emitting secondary-electrons in response to electron incident from space between the first and second holes, disposed between the first and second base; inclined potential generating electrodes for applying voltage between inside and outside portions of the electron multiplier; and a multiplied-electron detector, for detecting electrons outputted from the electron multiplier, disposed outside of the electron multiplier.

With the 1st aspect of the present invention, since the secondary-electron detector has a form of a part of column, it is possible to constitute a SEM by incorporating it in a miniaturized electron-beam system.

In the 2nd aspect of the present invention, there is provided a secondary-electron detector as defined in the 1st aspect, wherein the inclined potential generating electrodes have first and second resistance layers coated on opposed sides of the first and second bases, respectively.

With the 2nd aspect of the present invention, it is not necessary to form an obstacle such as a net-shaped electrode on the incident plane.

In the 3rd aspect of the present invention, there is provided a secondary-electron detector as defined in the 2nd aspect, wherein the electron multiplier have first and second secondary-electron emissive material layers coated on opposed sides of the first and second bases, respectively.

With the 3rd aspect of the present invention which has a simple construction, the likewise effect can be obtained as in a case where a number of secondary-electron detectors are disposed in a narrow space in all directions.

In the 4th aspect of the present invention, there is provided a secondary-electron detector as defined in the 3rd aspect, wherein the multiplied-electron detector is a multiplied-electron collecting electrode disposed between the first and second bases.

In the 5th aspect of the present invention, there is provided a secondary-electron detector as defined in the 4th aspect, wherein the multiplied-electron collecting electrode functions as spacers between the first and second bases.

In the 6th aspect of the present invention, there is provided a secondary-electron detector as defined in the 3rd aspect, wherein the multiplied-electron detector is an optical fiber coated with phosphor.

With the 6th aspect of the present invention, it is possible to output optical signals.

In the 7th aspect of the present invention, there is provided a secondary-electron detector as defined in the 4th aspect, wherein the first and second bases are made of semiconductor or metal, the secondary-electron detector further comprising: a first insulating layer formed between the first resistance layer and the first base, excepting the inside portion of the first base; a first lead electrode formed on outside portion of the first resistance layer; a second insulating layer formed between the second resistance layer and the second base, excepting the inside portion of the second base; and a second lead electrode formed on outside portion of the second resistance layer; wherein the first and second resistance layers are formed on the inside portion of the first and second bases respectively, and wherein the multiplied-electron collecting electrode is disposed between the first and second insulating layers.

In the 8th aspect of the present invention, there is provided a secondary-electron detector as defined in the 7th aspect, wherein edge portion around the first hole of the first base protrudes to second hole side with its protruding surface inclining.

With the 8th aspect of the present invention, the capture ratio of electrons reflected on the sample can be increased.

In the 9th aspect of the present invention, there is provided a secondary-electron detector as defined in the 1st aspect, wherein the electron multiplier is a porous substance formed by sintering glass beads covered with partially conductive, secondary-electron emissive material.

With the 9th aspect of the present invention which has a simple construction, the likewise effect can be obtained as in a case where a number of secondary-electron detectors are disposed in a narrow space in all directions.

In the 10th aspect of the present invention, there is provided a secondary-electron detector as defined in the 9th aspect, wherein the inclined potential generating electrodes have first and second electrodes formed on inner and outer peripherals of the porous substance, respectively.

In the 11th aspect of the present invention, there is provided a secondary-electron detector as defined in the 1st aspect, wherein the second hole to be disposed on a sample side is wider than the first hole to be disposed on an electron gun side.

With the 11th aspect of the present invention, the capture ratio of secondary-electrons or reflection electrons can be improved.

In the 12th aspect of the present invention, there is provided a secondary-electron detector as defined in the 1st aspect, wherein the multiplied-electron detectors are disposed at a plurality of positions in different directions from the first and second holes.

With the 12th aspect of the present invention, with only one secondary-electron detector, it is possible to detect the quantity of secondary-electrons or reflection electrons of each direction from the point of beam irradiation.

In the 13th aspect of the present invention, there is provided a secondary-electron detector as defined in the 1st aspect, further comprising at least three spherical particles; wherein the first base have recesses into which the spherical particles are disposed, respectively, wherein the second base have recesses corresponding to the recesses on the first base, and wherein the first base and the second base are aligned with the spherical particles being placed between the recesses on the first base and corresponding the recesses on the second bases.

With the 13th aspect of the present invention, it is possible to easily align the first base with the second base, and its assembling work can be facilitated.

In the 14th aspect of the present invention, there is provided a secondary-electron detector as defined in the 1st aspect, further comprising a fiber; wherein the first base have a groove into which the fiber is disposed, wherein the second base have a groove corresponding to the groove on the first base; and wherein the first base and the second base are aligned with the fiber being placed between the grooves on the first and second bases.

With the 14th aspect of the present invention, it is possible to easily align the first base with the second base, and its assembling work can be facilitated.

In the 15th aspect of the present invention, there is provided a secondary-electron detector as defined in the 14th aspect, wherein the multiplied-electron detector is a conductive film coated onto the fiber.

With the 15th aspect of the present invention, the construction thereof can be simplified.

In the 16th aspect of the present invention, there is provided a secondary-electron detector as defined in the 14th aspect, wherein the fiber is an optical fiber and the groove is band-shaped.

In the 17th aspect of the present invention, there is provided an electron-beam system, comprising: an electron gun for emitting electrons; an object lens disposed at the downstream side of the electron gun concentrically with the electron gun; and a secondary-electron detector disposed concentrically with the object lens; wherein the secondary-electron detector, comprising: a first base having a first hole; a second base, having a second hole corresponding to the first hole, opposed to the first base with placing downstream side from the first base; an electron multiplier, for multiplying the number of electrons by emitting secondary-electrons in response to electron incident from space between the first and second holes, disposed between the first and second base; inclined potential generating electrodes for applying voltage between inside and outside portions of the electron multiplier; and a multiplied-electron detector, for detecting electrons outputted from the electron multiplier, disposed outside of the electron multiplier.

In the 18th aspect of the present invention, there is provided an electron-beam system as defined in the 17th aspect, further comprising a limiting aperture disposed between the electric gun and the object lens.

In the 19th aspect of the present invention, there is provided an electron-beam system as defined in the 17th aspect, further comprising a deflector for deflecting the electrons.

In the 20th aspect of the present invention, there is provided an electron-beam system as defined in the 19th aspect, wherein a combination of the electron gun, the limiting aperture, the object lens, the secondary-electron detector and the deflector is arrayed plurally.

Further aspects, objects, and the advantages of the present invention will become apparent from the following detailed description taken in connection with the accompanying drawings.

DESCRIPTION OF THE EMBODIMENTS

Figure 1:
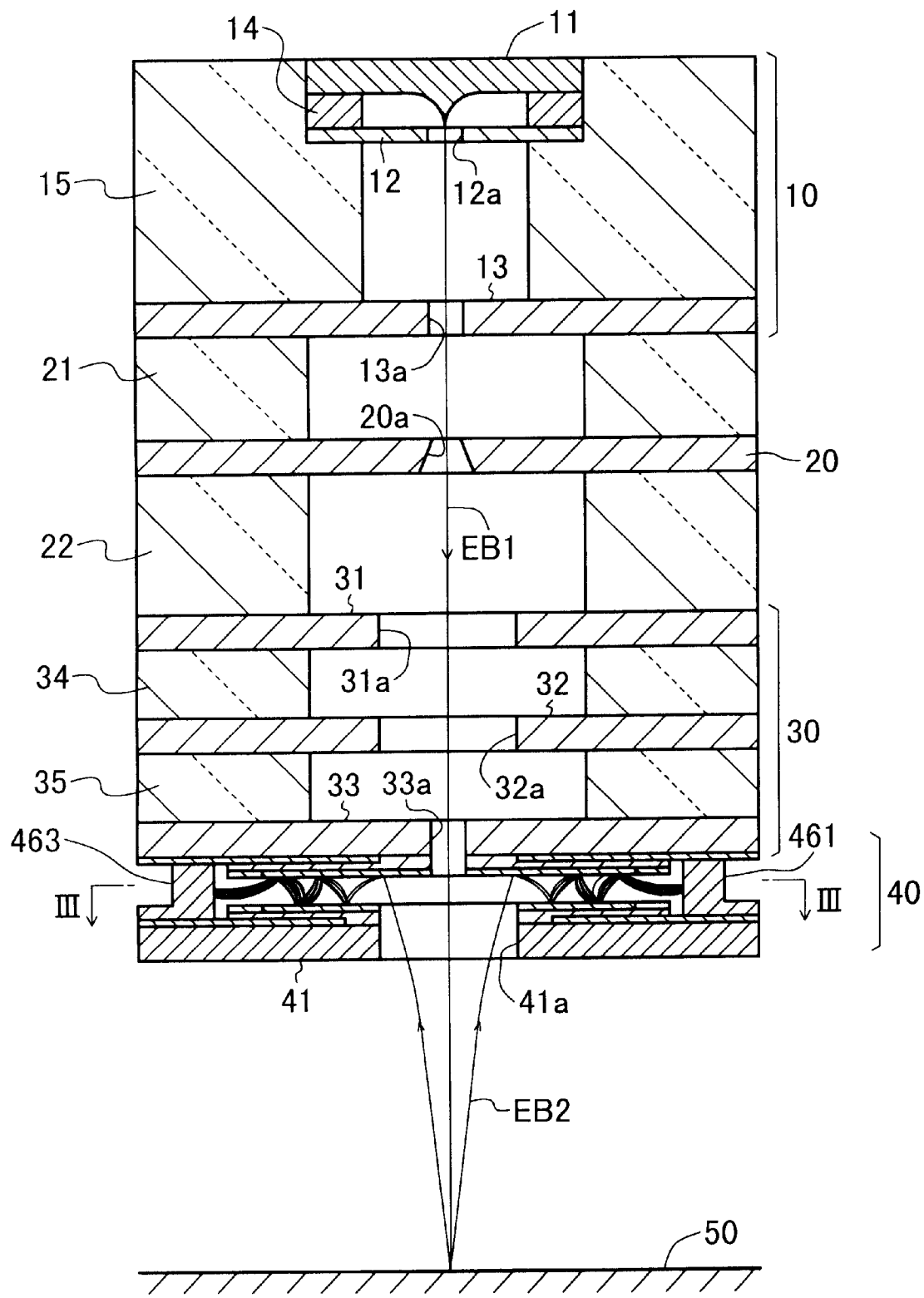
FIG. 1 is a longitudinal sectional view of a miniaturized electron-beam system according to a first embodiment of the present invention.

Referring now to the drawings, wherein like reference characters designate like or corresponding parts throughout several views, preferred embodiments of the present invention are described below.

First Embodiment

FIG. 1 is a longitudinal sectional view of a miniaturized electron-beam system according to the first embodiment of the present invention.

With this system, an electron beam EB1 is emitted from an electron gun 10 and goes through a limiting aperture 20. The electrons of EB1 are deflected by an Einzel lens 30 in the direction of convergence, pass through a miniaturized secondary-electron detector 40, are converged and irradiated onto a sample 50, wherein secondary-electrons EB2 emitted from the point of irradiation are detected by the miniaturized secondary-electron detector 40.

The electron gun 10, limiting aperture 20 and Einzel lens 30 each are constructed as already known in prior arts, and are symmetrical in rotation with respect to an optical axis.

The electron gun 10 is constructed as follows. Extraction electrode 12 and anode 13 are disposed opposite to the projection of a cathode 11. Round holes 12a and 13a are formed at the center of the extraction electrode 12 and anode 13, respectively. An insulating layer 14 is formed between the cathode 11 and the extraction electrode 12, and a spacer 15 is joined between the extraction electrode 12 and the anode 13.

As regards the materials of the electron gun 10, for example, the cathode 11 is made of Si or Mo, the insulating layer is made of $SiO_2$, the extraction electrode 12 and anode 13 are made of Si or metal, and the spacer 15 is made of glass. As regards the size of the electron gun 10, the insulating layer 14 is 100 µm thick, the round holes 12a and 13a are, respectively, 5 µm and 100 µm, and the outer diameter of the anode 13 is 600 µm. The applied voltage is, for example, 100V for the extraction electrode 12 and 1 kV for the anode 13, with reference to the potential of the cathode 11.

The spacer 15 and subsequent spacers are hollow-columnar so as to form a column, and they have nearly the same thermal expansion coefficient as that of, for example, an Si plate which is placed therebetween, and are made of, for example, borosilicate glass. Si and glass can be fused by anodic bonding.

The limiting aperture 20 is formed of, for example, Si, and a round hole 20a, the diameter of which is, for example, 2 µm, is formed at the center thereof. A spacer 21 is joined between the limiting aperture 20 and the anode 13, and a spacer 22 is joined between the limiting aperture 20 and the electrode 31 of the Einzel lens 30.

The Einzel lens 30 is constructed such that the electrodes 31, 32 and 33 are concentrically disposed, a spacer 34 is joined between the electrodes 31 and 32 and another spacer 35 is joined between the electrodes 32 and 33. Round holes 31a, 32a, and 33a are formed at the center portion of the electrodes 31, 32 and 33, respectively. For example, the electrodes 31, 32 and 33 are made of Si and are 100 µm thick, and each of the interval between the electrodes 31 and 32 and that between the electrodes 32 and 33 is 400 µm. For example, the bore diameters of the round holes 31a, 32a and 33a are, respectively, 100 µm, 100 µm and 50 µm. For example, positive or negative potential is applied onto the electrode 32 while potential of 0V is applied onto the electrodes 31 and 33.

In a miniaturized secondary-electron detector 40, the electrode 33 which is a part of the Einzel lens 30 is used as a base, the round bases 33 and 41 are disposed so as to concentrically confront each other, and a round hole 41a is formed at the center portion of the base 41. The bore diameter of the round hole 41a is larger than that of the round hole 33a in order to capture incident electrons.

Figure 2:
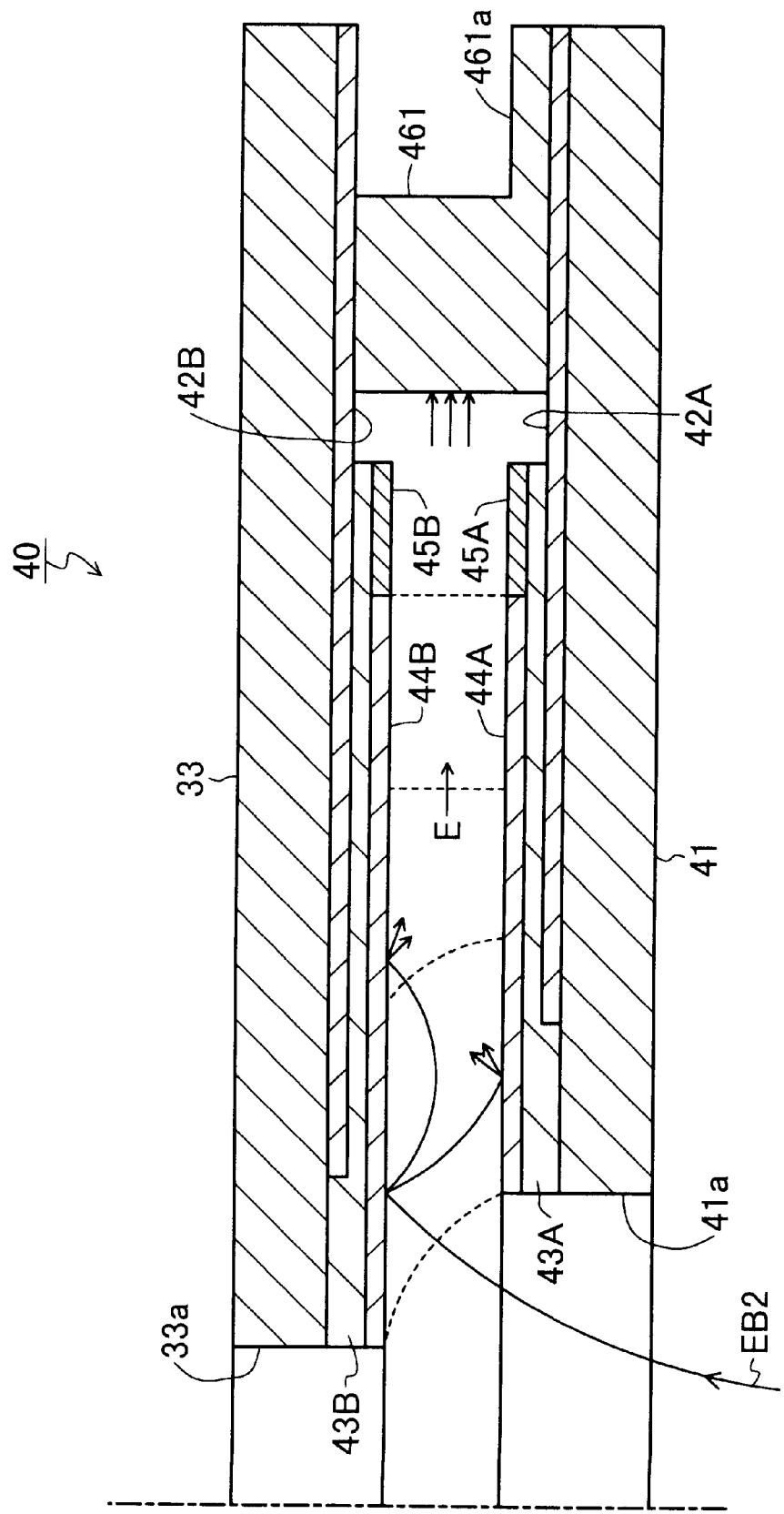
FIG. 2 is an enlarged sectional half view of the miniaturized secondary-electron detector of FIG. 1.
Figure 3:
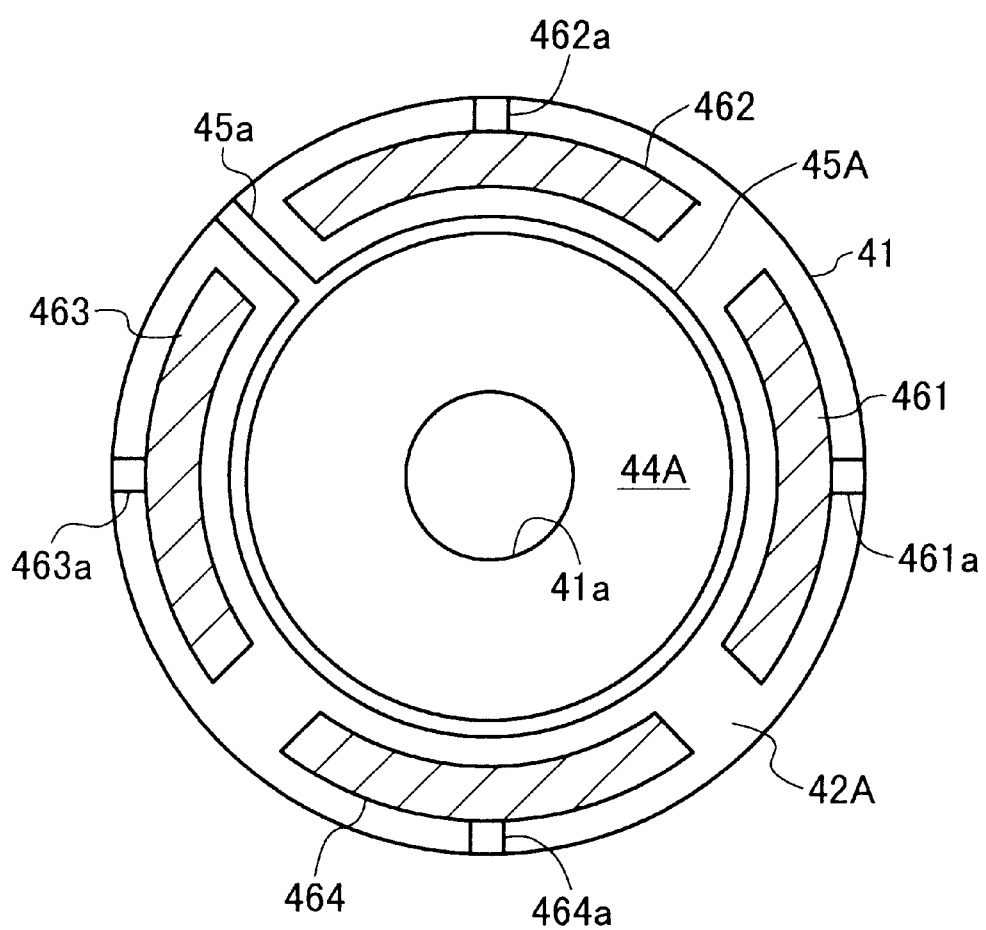
FIG. 3 is a cross-sectional view taken along the line III—III of the miniaturized secondary-electron detector of FIG. 1.

FIG. 2 is an enlarged sectional half view of the miniaturized secondary-electron detector of FIG. 1, and FIG. 3 is a cross-sectional view of the detector 40 taken along the line III—III in FIG. 1.

Ring-shaped insulating layer 42A and 42B are coated onto the opposed sides of the bases 41 and 33, excepting the inside portions. Ring-shaped high resistance layers 43A and 43B are coated to these inside portions and portions other than the outside portions on the insulating layers 42A and 42B. Ring-shaped secondary-electron multiplying layers 44A and 44B are coated onto the high resistance layers 43A and 43B, excepting the outside ring-shaped portion. Electrodes 45A and 45B are, respectively, coated on the outside ring-shaped portion of high resistance layers 43A and 43B, and arc-shaped multiplied-electron collecting electrodes 461 to 464 are connected between the insulating layers 42A and 42B outside the electrodes 45A and 45B. The electrodes 461 to 464 also function as a spacer between the bases 41 and 33. Lead wires 461a to 464a extend on the insulating layer 42A at the outside middle part of the electrodes 461 to 464.

A detailed example of material and size of the detector 40 is as follows:

Bases 33 and 41: n type or p type Si

Insulating layers 42A and 42B: $SiO_2$

High resistance layers 43A and 43B: Polysilicone

Secondary electron emissive material layer 44A and 44B: materials such as $Al_2O_3$, PbO or MgO, etc. generally used for MCP Electrodes 45A and 45B: Al or Au Multiplied-electron collecting electrodes 461 to 464: n type or p type Si, Mo or C Diameter of round hole 33a: 50 µm Diameter of round hole 41a: 200 µm Interval between the secondary-electron emissive material layers 44A and 44B: 100 to 200 µm.

Next, the operation of the first embodiment constructed as above will be described.

For example, potential of 0V is applied to the bases 41 and 33 and potential within a range from several hundreds of volts through 2 kV is applied to the electrodes 45A and 45B. The higher the potential becomes, the more favorable it is because the multiplication ratio is increased. However, since an electric discharge occurs if the potential is too high, the potential value is limited. The potential which causes an electric discharge differs depending upon the size of electrode. By applying the potential to the electrodes 45A and 45B, the potential on the high resistance layers 43A and 43B becomes larger and larger from the inside toward the outside, the equal potential planes are generated between the secondary-electron emissive material layers 44A and 44B as shown with dashed lines, thereby causing an electric field in the normal direction to the equal potential plane. 0V or positive potential is applied to each of the multiplied-electron collecting electrodes 461 through 464.

If an electron beam EB1 of, for example, 1 kV is irradiated onto a sample 50, secondary-electrons of several volts are emitted from the point of irradiation, and hits the secondary-electron emissive material layer 44B, whereby a plurality of secondary multiplied-electrons are emitted from the layer 44B and these electrons are accelerated in the outside direction by the electric field between the layers 44A and 44B until they hit the layer 44A or 44B. Therefore, as shown in FIG. 1, the electrons are multiplied and are made incident into the electrodes 461 through 464.

The respective electrodes 461 to 464 are connected to amplifiers (not illustrated) via lead wires 461a to 464a from which signals responsive to the quantity of the secondary-electrons EB2 in four directions at the point of irradiation can be picked up.

An electron-beam system in FIG. 1 is made to scan by a movable stage (not illustrated), thereby an image of a pattern or a foreign matter on the sample 50 can be obtained.

A secondary-electron detector 40 according to the first embodiment of the present invention is used as a part of a column of a miniaturized electron-beam system, so the miniaturized electron-beam system can be used not only for lithography but also as a SEM.

Second Embodiment

Figure 4:
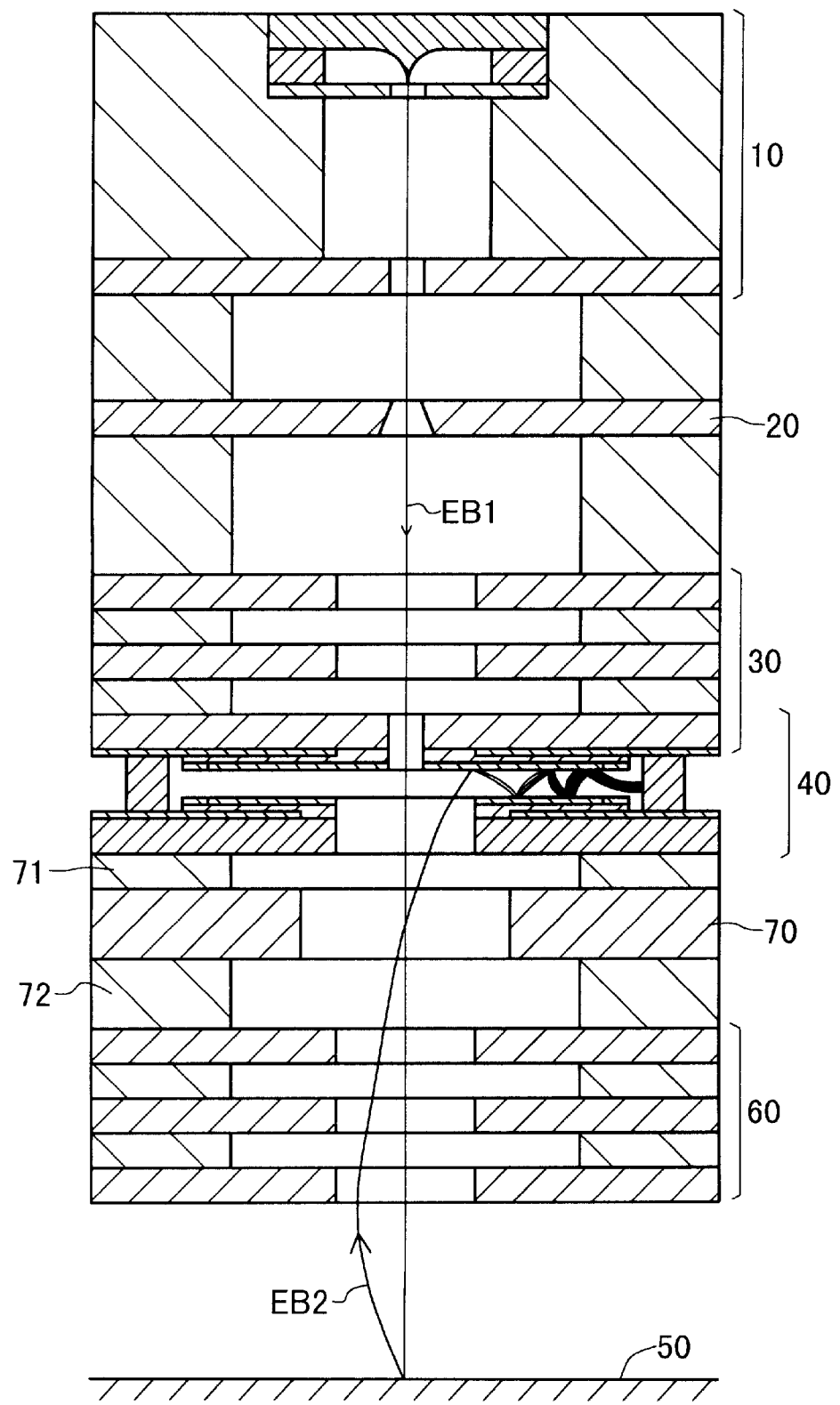
FIG. 4 is a longitudinal sectional view of a miniaturized electron-beam system according to a second embodiment of the present invention.

FIG. 4 is a cross-sectional view of a miniaturized electron-beam system according to a second embodiment of the present invention.

In this system, an Einzel lens 60 is disposed beneath the miniaturized secondary-electron detector 40 in addition to the construction shown in FIG. 1, wherein, for example, an eight-pole deflector 70 joined between insulating spacers 71 and 72 is disposed between the detector 40 and the lens 60.

All the other points are identical to those of the construction of FIG. 1.

According to this electron-beam system, the electron beam EB1 is scanned by the deflector 70, wherein signals responsive to a pattern shape on the sample 50 can be outputted from the multiplied-electron collecting electrodes 461 through 464. The scanning may be combined with the scanning by a movable stage (not illustrated).

Third Embodiment

Figure 5:
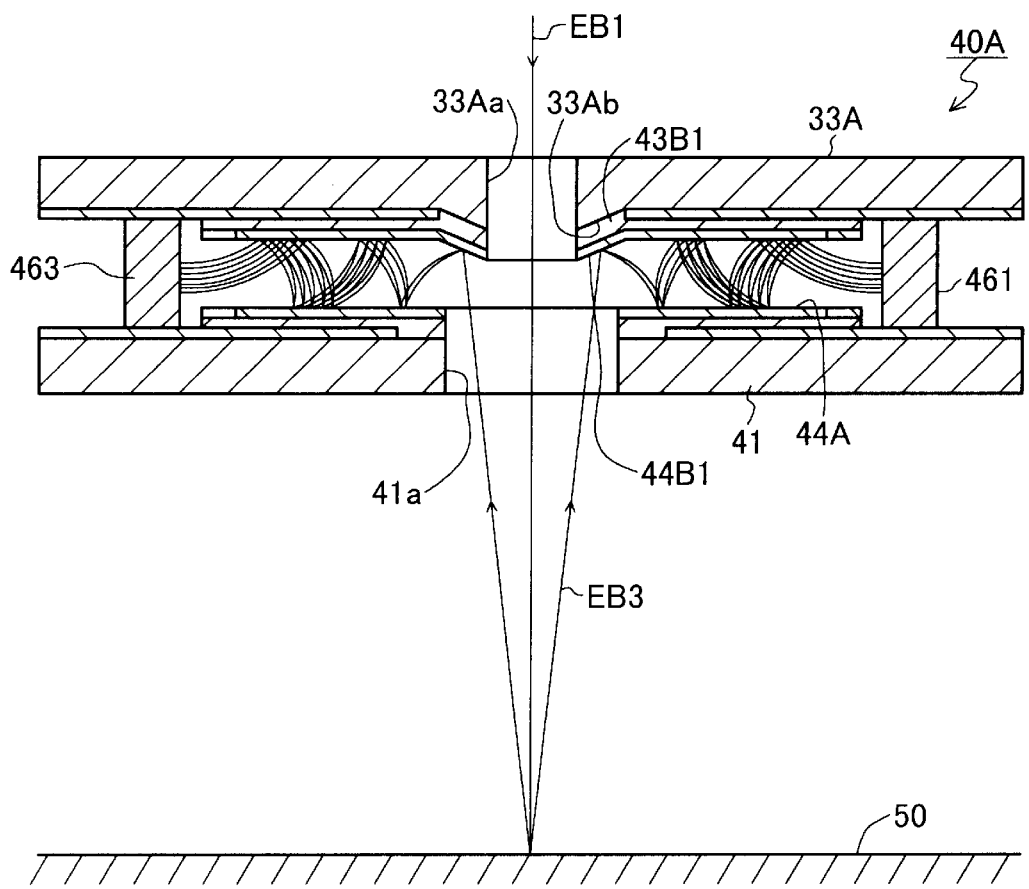
FIG. 5 is a longitudinal sectional view of a miniaturized secondary-electron detector according to a third embodiment of the present invention.

FIG. 5 is a longitudinal sectional view of a miniaturized secondary-electron detector 40A according to a third embodiment of the present invention.

In the detector, an edge part of the round hole 33Aa of the base 33A protrudes to the base 41 side to cause a conical trapezoidal inclination plane 33Ab to be formed. A secondary-electron emissive material layer 44B1 is formed on the inclination plane 33Ab via a high resistance layer 43B1.

All the other points are identical to those of the miniaturized secondary-electron detector 40 shown in FIG. 1.

In the above-mentioned construction, a part of the electron beam EB1 irradiated onto the sample 50 is reflected, and the reflected electron EB3 hits the inclination plane of the secondary-electron emissive material layer 44B1, from which secondary-electrons are outputted to the secondary-electron emissive material layer 44A side.

Fourth Embodiment

Figure 6:
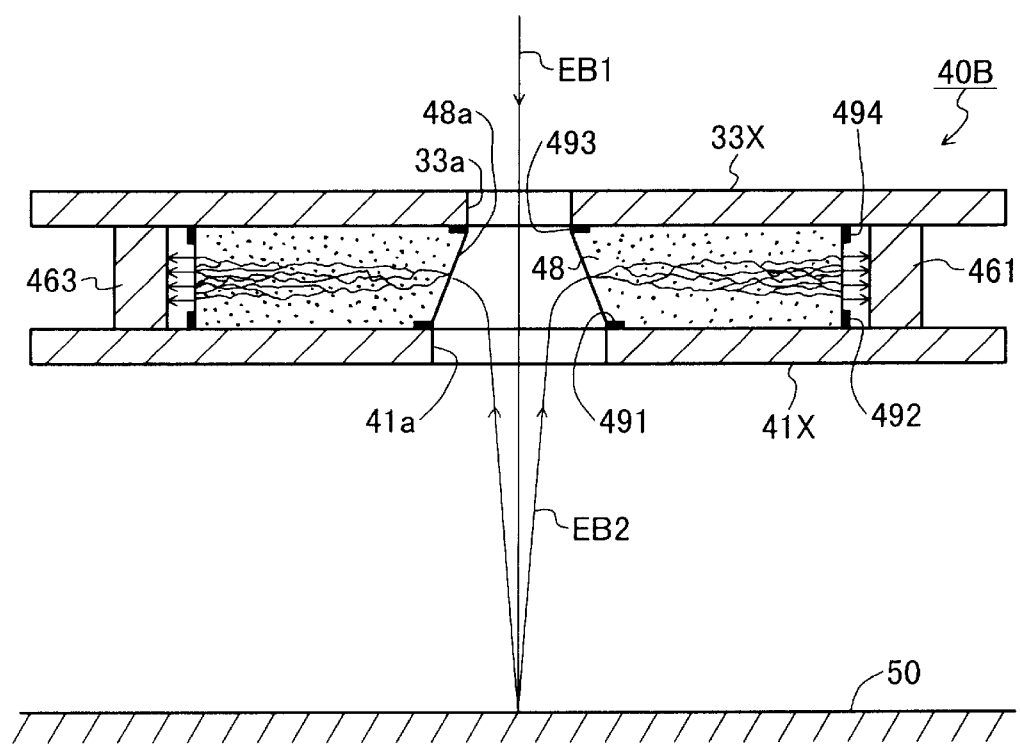
FIG. 6 is a longitudinal sectional view of a miniaturized secondary-electron detector according to a fourth embodiment of the present invention.

FIG. 6 is a cross-sectional view of a miniaturized secondary-electron detector 40B according to a fourth embodiment of the present invention.

In the detector, instead of the secondary-electron emissive material layers 44A and 44B in FIG. 2, a porous secondary-electron multiplication substance 48 is disposed between bases 33X and 41X which are insulating disks made of, for example, glass. The substance 48 is symmetrical in rotation, wherein a conical trapezoidal hole 48a is formed at the center.

The porous secondary-electron multiplication substance 48 is produced by sintering glass beads covered with partially conductive, secondary-electron emissive material. The substance 48 may be, for example, the same as that used inside an MSP (Micro Sphere Plate) made by El-Mul Technologies, Ltd.

In order to generate an inclination of potential from the inside end toward the outside end of the substance 48, ring-shaped electrodes 491 and 492 are formed on the base 41X and at the inside and outside of the substance 48, respectively, while ring-shaped electrodes 493 and 494 are formed on the base 33X and at the inside and outside of the substance 48, respectively.

All the other points are identical to those of the miniaturized secondary-electron detector 40 in FIG. 1.

In the above-mentioned construction, for example, potential of 0V is applied to the electrodes 491 and 493 and potential within a range from several hundreds of volts through 2 kV is applied to the electrodes 492 and 494. As described above, the larger this potential becomes, the more favorable it is because the multiplication ratio is increased. However, since an electric discharge occurs if the potential is too large, the potential value is limited. When the secondary-electrons EB2 from the sample 50 are made incident into the inner peripheral surface of the substance 48, they are accelerated, passing through the gap between particles until the secondary-electrons EB2 hit the secondary-electron multiplication substance therein. Hitting the secondary-electron multiplication substance, the secondary-electrons are emitted and thereby the number of electrons is multiplied. As the electrons come out of the outer peripheral surface of the substance 48, electrons having speed component in the outside direction are made incident into the multiplied-electron collecting electrodes 461 and 463 and other ones (not illustrated) in the perpendicular direction to the drawing paper.

It is to be noted that instead of electrodes 491 through 494, a net-shaped electrode may be formed on each of the inner and outer peripheral surfaces of the substance 48, or high resistance layers 43A and 43B in FIG. 2 may be used.

Fifth Embodiment

Figure 7A:
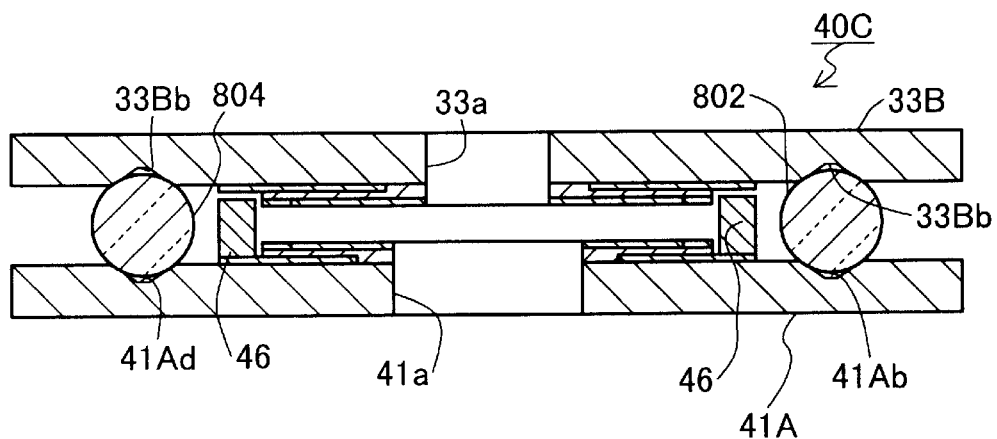
FIG. 7(A) is a longitudinal sectional view of a miniaturized secondary-electron detector according to a fifth embodiment of the present invention.
Figure 7B:
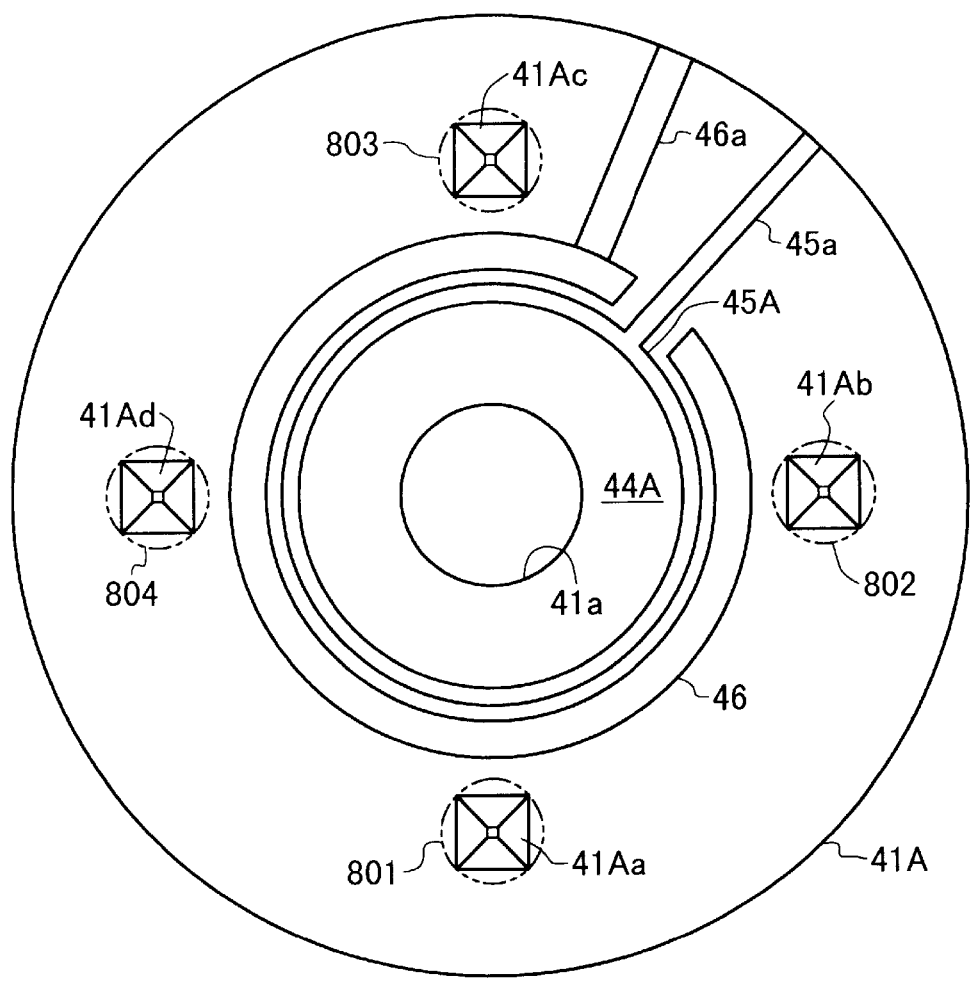
FIG. 7(B) is a plan view of the lower portion of this detector.

FIG. 7(A) is a longitudinal sectional view of a miniaturized secondary-electron detector 40C according to a fifth embodiment of the present invention, and FIG. 7(B) is a plan view showing the lower part of the detector.

Inverse pyramid-shaped recesses 41Aa through 41Ad each are formed on the base 41A at positions apart 90° from adjacent ones, and balls 801 to 804 are placed therein, respectively. Similarly in the base 33B, recesses are formed at positions corresponding to the recesses 41Aa through 41Ad, and recesses 33Bb and 33Bd each corresponding to the recesses 41Ab and 41Ad are illustrated in FIG. 7(A).

A multiplied-electron collecting electrode 46 is C-shaped and is connected to a lead wire 46a extending outside. Although no direction information is obtained with respect to the secondary-electrons thus detected since the electrode 46 is not divided, the detection circuit (not illustrated) to be connected to the lead wire 46a can be single.

All the other points are identical to those of the first embodiment.

Balls 801 to 804 are, respectively, placed in the recesses 41Aa to 41Ad, and the base 33B is made to move near the base 41A from above the base 41A and is made into a state shown in FIG. 7(A), thereby it is possible to easily align the bases 41A and 33B with each other, and the assembling work can be facilitated.

The variation of the recesses 41Aa to 41Ad with regard to their size can be diminished by dry etching technology for semiconductor. Furthermore, glass beads having precisely controlled diameters may be used as the balls 801 through 804 and therefore, it is possible to easily select glass beads having little variation of the diameter. Accordingly, according to the fifth embodiment, the positional alignment precision between the bases becomes high.

Sixth Embodiment

Figure 8A:
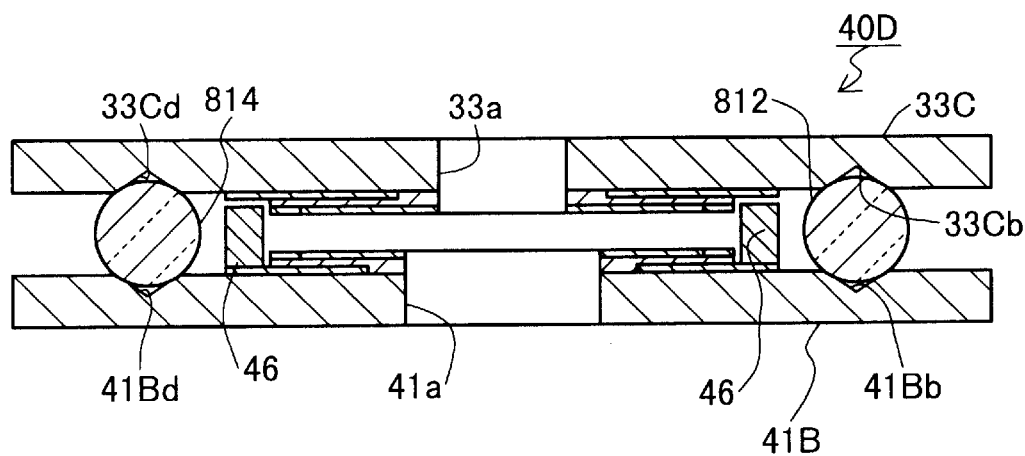
FIG. 8(A) is a longitudinal sectional view of a miniaturized secondary-electron detector according to a sixth embodiment of the present invention.
Figure 8B:
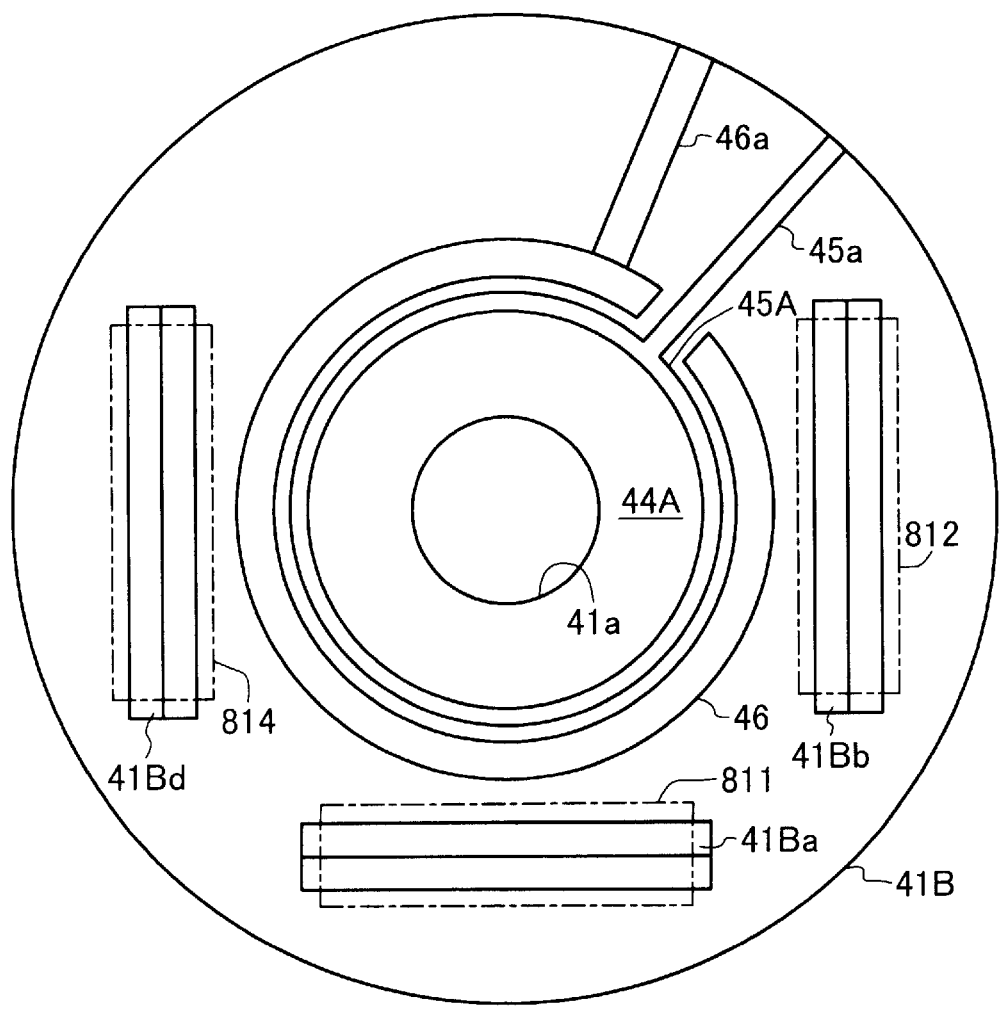
FIG. 8(B) is a plan view of the lower portion of this detector.

FIG. 8(A) is a longitudinal sectional view of a miniaturized secondary-electron detector 40D according to the sixth embodiment of the present invention, and FIG. 8(B) is a plan view showing the lower part of the detector.

In the detector, V-shaped grooves 41B*a*, 41B*b* and 41B*d* are formed on the base 41B instead of the recesses 41A*a* to 41A*d* in FIG. 7(B), and fibers 811, 812 and 814 are, respectively, disposed into them. The base 33C is similar to base 41B, wherein in FIG. 8(A), V-shaped grooves 33C*b* and 33C*d* corresponding to the V-shaped grooves 41B*b* and 41B*d* are illustrated. Fibers having precisely controlled diameters are, for example, optical fibers and it is possible to easily obtain optical fibers having little variation of the diameter.

All the other points are identical to those of the fifth embodiment.

With the sixth embodiment, effects similar to those of the fifth embodiment can be obtained.

Seventh Embodiment

Figure 9A:
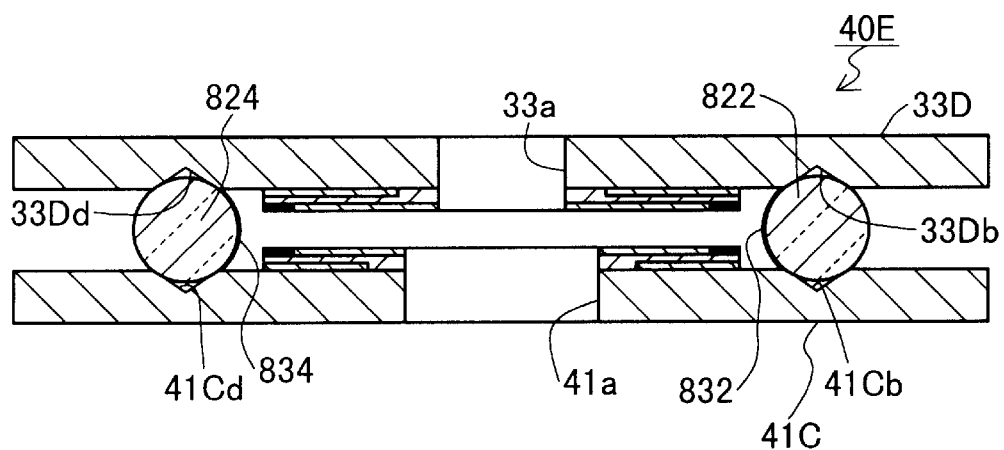
FIG. 9(A) is a longitudinal sectional view of a miniaturized secondary-electron detector according to a seventh embodiment of the present invention.
Figure 9B:
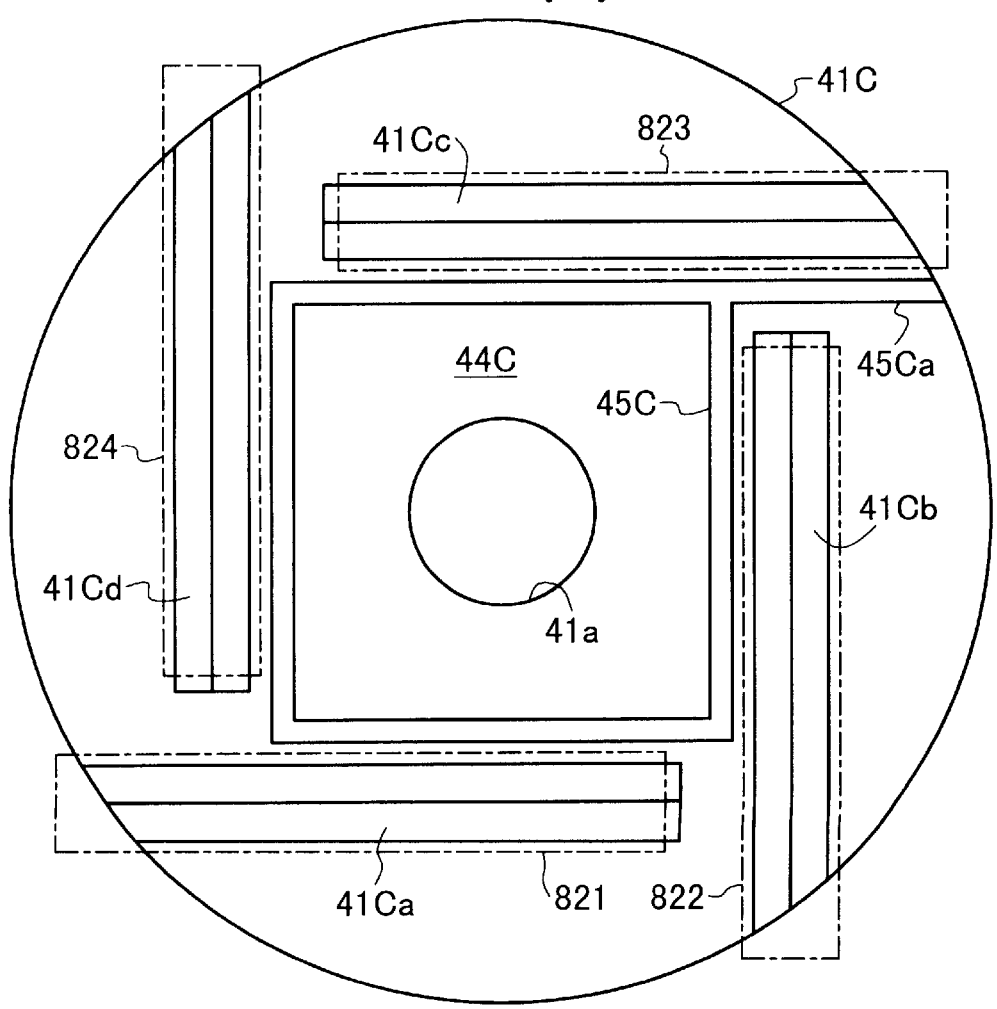
FIG. 9(B) is a plan view of the lower portion of this detector.

FIG. 9(A) is a longitudinal sectional view of a miniaturized secondary-electron detector 40E according to a seventh embodiment of the present invention, and FIG. 9(B) is a plan view showing the lower part of the detector.

In the detector, as in FIG. 2 excepting the shape thereof, a rectangular secondary-electron emissive material layer 44C and electrode 45C are formed on the base 41C via an insulating film and a rectangular high resistance layer, which are not illustrated. V-shaped grooves 41C*a* through 41C*d*, into which optical fibers 821 through 824 are, respectively, disposed, are formed on the base 41C along the four sides of the electrode 45C. The base 33D is similar to the base 41C, wherein V-shaped grooves 33D*b* and 33D*d* each corresponding to the V-shaped grooves 41C*b* and 41C*d* are illustrated in FIG. 9(A).

Furthermore, a multiplied-electron collecting electrode 46 in FIGS. 8(A) and 8(B) is omitted, and instead thereof, a conductive film is coated onto each of the surfaces of optical fibers. FIG. 9(A) shows conductive films 832 and 834 partly coated on the optical fibers 822 and 824, respectively, without contacting the bases 33D and 41C.

All the other points are identical to those of the sixth embodiment.

With the miniaturized secondary-electron detector 40E according to the seventh embodiment, the construction thereof is made simpler than that of the miniaturized secondary-electron detector 40D in FIG. 8, in addition to the effects of the sixth embodiment.

Eighth Embodiment

Figure 10:
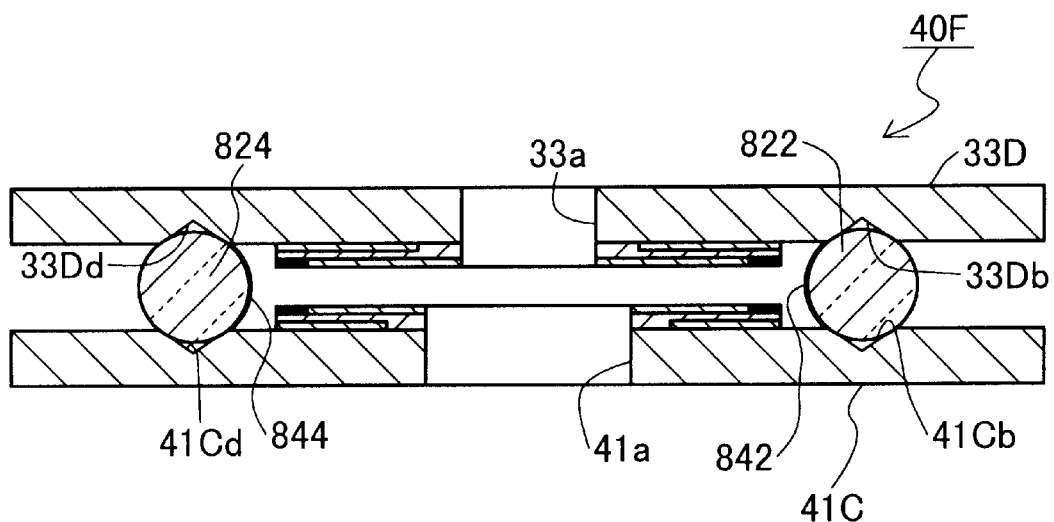
FIG. 10 is a longitudinal sectional view of a miniaturized secondary-electron detector according to an eighth embodiment of the present invention.

FIG. 10 is a longitudinal sectional view of a miniaturized secondary-electron detector 40F of an eighth embodiment of the present invention.

In the detector, phosphor is coated instead of conductive films on the optical fibers in FIG. 9(A), and FIG. 10 shows phosphors 842 and 844 which are coated onto the optical fibers 822 and 824.

All the other points are identical to those of the seventh embodiment.

Secondary electrons multiplied by passing through a gap between the bases 41C and 33D hit the phosphors 842, 844 and other ones (not illustrated) existing in the perpendicular direction to the drawing paper, wherein fluorescence is emitted and outputted through the above-mentioned optical fibers, and is detected by an optical detector (not illustrated), for example, a photomultiplier.

Ninth Embodiment

Figure 11:
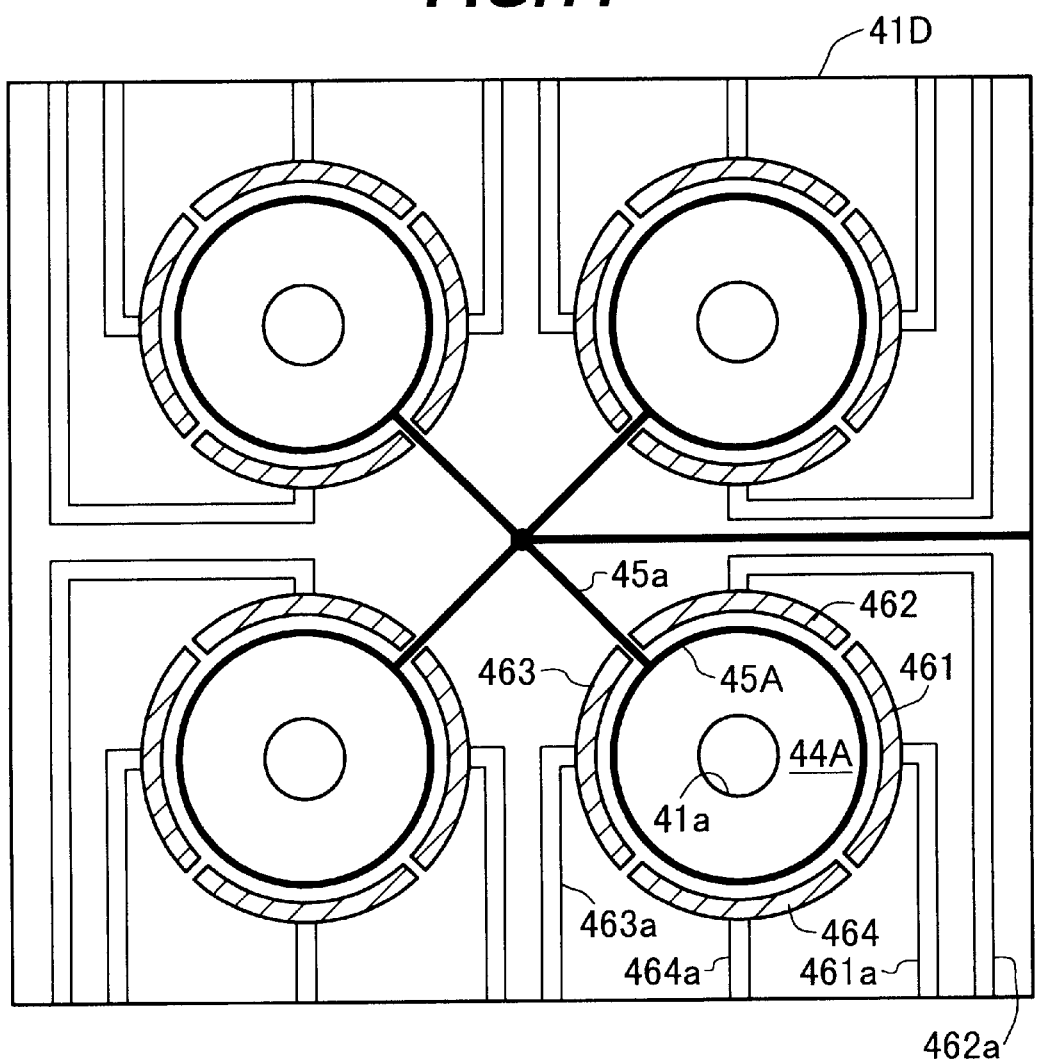
FIG. 11 is a plan view of a multiple secondary-electron detector according to a ninth embodiment of the present invention.

FIG. 11 is a plan view showing the lower part of a multiple secondary-electron detector according to a ninth embodiment of the present invention.

2×2 number of Secondary electron detectors each having the same construction as that in FIG. 3 are disposed on the base 41D, and the same reference numbers as those in FIG. 3 are given to them. Potential is given from one line 450 to the lead wire 45*a* and those corresponding to the other three.

As regards the upper part and middle part of the multiple secondary-electron detector, each of these four sections are identical to the construction of the above-mentioned first embodiment.

In the prior art, since a miniaturized secondary-electron detector, which was applicable to a miniaturized electron-beam system, did not exist, it was impossible to construct a multiple micro SEM. However, with the present invention, it is possible to construct the same.

What is claimed is:

1. A secondary-electron detector, comprising:

a first base having a first hole;

a second base, having a second hole corresponding to said first hole, opposed to said first base;

an electron multiplier, for multiplying the number of electrons by emitting secondary-electrons in response to electron incident from space between said first and second holes, disposed between said first and second bases;

inclined potential generating electrodes for applying voltage between inside and outside portions of said electron multiplier; and a multiplied-electron detector, for detecting electrons outputted from said electron multiplier, disposed outside of said electron multiplier.

2. A secondary-electron detector according to claim 1, wherein said inclined potential generating electrodes have first and second resistance layers coated on opposed sides of said first and second bases, respectively.

3. A secondary-electron detector according to claim 2, wherein said electron multiplier have first and second secondary-electron emissive material layers coated on opposed sides of said first and second bases, respectively.

4. A secondary-electron detector according to claim 3, wherein said multiplied-electron detector is a multiplied-electron collecting electrode disposed between said first and second bases.

5. A secondary-electron detector according to claim 4, wherein said multiplied-electron collecting electrode functions as spacers between said first and second bases.

6. A secondary-electron detector according to claim 4, wherein said first and second bases are made of semiconductor or metal, said secondary-electron detector further comprising:

a first insulating layer formed between said first resistance layer and said first base, excepting the inside portion of said first base;

a first lead electrode formed on outside portion of said first resistance layer;

a second insulating layer formed between said second resistance layer and said second base, excepting the inside portion of said second base; and a second lead electrode formed on outside portion of said second resistance layer;

wherein said first and second resistance layers are formed on said inside portion of said first and second bases respectively, and wherein said multiplied-electron collecting electrode is disposed between said first and second insulating layers.

7. A secondary-electron detector according to claim 6, wherein edge portion around said first hole of said first base protrudes to the second hole side with its protruding surface inclining.

8. A secondary-electron detector according to claim 3, wherein said multiplied-electron detector is an optical fiber coated with phosphor.

9. A secondary-electron detector according to claim 1, wherein said electron multiplier is a porous substance formed by sintering glass beads covered with partially conductive, secondary-electron emissive material.

10. A secondary-electron detector according to claim 9, wherein said inclined potential generating electrodes have first and second electrodes formed on inner and outer peripherals of said porous substance, respectively.

11. A secondary-electron detector according to claim 1, wherein said second hole to be disposed on a sample side is wider than said first hole to be disposed on an electron gun side.

12. A secondary-electron detector according to claim 1, wherein the multiplied-electron detectors are disposed at a plurality of positions in different directions from said first and second holes.

13. A secondary-electron detector according to claim 1, further comprising at least three spherical particles;
wherein said first base have recesses into which said spherical particles are disposed, respectively,
wherein said second base have recesses corresponding to said recesses on said first base, and
wherein said first base and said second base are aligned with said spherical particles being placed between said recesses on said first base and corresponding said recesses on said second bases.

14. A secondary-electron detector according to claim 1, further comprising a fiber;
wherein said first base have a groove into which said fiber is disposed,
wherein said second base have a groove corresponding to said groove on said first base; and
wherein said first base and said second base are aligned with said fiber being placed between said grooves on said first and second bases.

15. A secondary-electron detector according to claim 14, wherein said multiplied-electron detector is a conductive film coated onto said fiber.

16. A secondary-electron detector according to claim 14, wherein said fiber is a optical fiber and said groove is band-shaped.

17. An electron-beam system, comprising:
an electron gun for emitting electrons;
an object lens disposed at the downstream side of said electron gun concentrically with said electron gun; and
a secondary-electron detector disposed concentrically with said object lens;
wherein said secondary-electron detector, comprising:
a first base having a first hole;
a second base, having a second hole corresponding to said first hole, opposed to said first base with placing downstream side from said first base;
an electron multiplier, for multiplying the number of electrons by emitting secondary-electrons in response to electron incident from space between said first and second holes, disposed between said first and second bases;
inclined potential generating electrodes for applying voltage between inside and outside portions of said electron multiplier; and
a multiplied-electron detector, for detecting electrons outputted from said electron multiplier, disposed outside of said electron multiplier.

18. An electron-beam system according to claim 17, further comprising a limiting aperture disposed between said electron gun and said object lens.

19. An electron-beam system according to claim 17, further comprising a deflector for deflecting said electrons.

20. An electron-beam system according to claim 19, wherein a combination of said electron gun, said limiting aperture, said object lens, said secondary-electron detector and said deflector is arrayed plurally.

* * * * *